United States Patent [19]

Takiar et al.

[11] Patent Number: 5,530,622
[45] Date of Patent: Jun. 25, 1996

[54] ELECTRONIC ASSEMBLY FOR CONNECTING TO AN ELECTRONIC SYSTEM AND METHOD OF MANUFACTURE THEREOF

[75] Inventors: Hem P. Takiar, Fremont; Michael W. Patterson, Pleasanton, both of Calif.

[73] Assignee: National Semiconductor Corporation, Santa Clara, Calif.

[21] Appl. No.: 363,156

[22] Filed: Dec. 23, 1994

[51] Int. Cl.⁶ .................................................. H05K 1/14
[52] U.S. Cl. .................. 361/737; 361/736; 361/752; 174/50; 257/679
[58] Field of Search .................................. 361/730, 736, 361/737, 752, 796, 728; 257/679; 174/50; 439/61, 62, 67, 59, 77, 152, 160, 377, 638, 928; 364/708.1

[56] References Cited

U.S. PATENT DOCUMENTS

| | | | |
|---|---|---|---|
| 5,038,250 | 8/1991 | Uenaka et al. | 361/395 |
| 5,161,169 | 11/1992 | Galano et al. | 375/8 |
| 5,457,601 | 10/1995 | Georgopulos et al. | 361/686 |
| 5,474,463 | 12/1995 | Robinson et al. | 439/159 |

OTHER PUBLICATIONS

AMP Catalog, Memory Card/PC Card Connectors, *Receptacle Assembly, Straddle–Mount*, Catalog 65701, Issued Jul. 1993, p. 7.
Mark Klein, *MCMs for the Rest of Us*, Electronic Packaging & Production, Nov. 1994, pp. 4–5.
Terry Costlow, *Multichips Modules Drive into Mainstream*, DESIGN, Electronic Engineering Times, Oct. 17, 1994, pp. 67, 71.
Terry Costlow, *Integral 1.8" Drive Boasts 420 Mbytes*, Electronic Engineering Times, Oct. 3, 1994, pp. 1, 98.

*Primary Examiner*—Leo P. Picard
*Assistant Examiner*—Y. Whang
*Attorney, Agent, or Firm*—Skjerven, Morrill, MacPherson, Franklin & Friel; Paul J. Winters; Graham Andrew C.

[57] ABSTRACT

An electronic assembly for connecting to an electronic system is disclosed which includes, in one embodiment, a connector having a group of contacts, each contact having a mating portion and an interconnect finger. A first circuitry module includes a group of leads providing a signal path to electronic components contained therewithin, wherein each of the leads is coupled directly to an interconnect finger of a corresponding one of the group of connector contacts. A protective body is rigidly coupled to the first connector and is formed to encase the first circuitry module and to provide support and protection to the circuitry module. In another embodiment suitable for a PCMCIA card assembly, each of a group of leads of a leaded chip-carrier module is directly connected to interconnect fingers of the connector. All the electronic circuitry of the electronic assembly is contained within the leaded chip-carrier, which affords a manufacturing cost of the PCMCIA card assembly which is leveraged by semiconductor assembly advances rather than driven largely by traditional surface mount technology (SMT) on printed wiring boards (PWB).

41 Claims, 6 Drawing Sheets

ELECTRONIC ASSEMBLY FOR CONNECTING TO AN ELECTRONIC SYSTEM AND METHOD OF MANUFACTURE THEREOF

BACKGROUND OF THE INVENTION

1. Field of the Invention

The present invention relates generally to the packaging of electronic assemblies, and more particularly, to electronic assemblies, such as a PCMCIA card assembly, suitable for attachment to electronic systems.

2. Description of Related Art

Electronic assemblies are useful in a wide variety of electronic systems for ease of configuration of specific capabilities of such a system. One such type of assembly includes interface devices which plug into either a serial or parallel port of a personal computer (PCs), such as security keys, video adapters, and LAN interfaces. Another such type of assembly are peripheral cards for personal computers. Until recently, most such cards were unprotected circuit boards, having edge connectors and carrying a variety of circuit components soldered thereto, and which cards were installed into a PC by opening the case of the PC and inserting the card's edge connector into a mating backplane connector.

Recently, a new type of PC peripheral card standard was adopted known as the PCMCIA card. Even though originally developed for memory expansion cards (the acronym "PCMCIA" stands for "Personal Computer Memory Card International Association"), this standard has since seen wide adoption in a wide variety of peripheral cards, such as RAM (volatile memory), FLASH EEPROM (non-volatile memory), hard disks, FAX/modems, data acquisition interfaces, and LAN interfaces, and has become virtually standard fare for recently introduced laptop, sub-laptop, and personal digital assistant (PDAs) computers. PCMCIA Interfaces are also available for more traditional desktop computers, as well.

PCMCIA cards are very popular because of their small size, standardized interface, standardized form factor, ease of end-user installation, and lower risk of end-user caused damage to a host electronic system. Nonetheless, cost is still a major issue, and lower cost still desired. Due to the extremely small size of a PCMCIA card, packaging costs are potentially higher than larger format packaging solutions. Assembling a PCMCIA card typically requires high precision, surface-mount (SMT), printed wiring board (PWB) manufacturing techniques.

Figure 1:
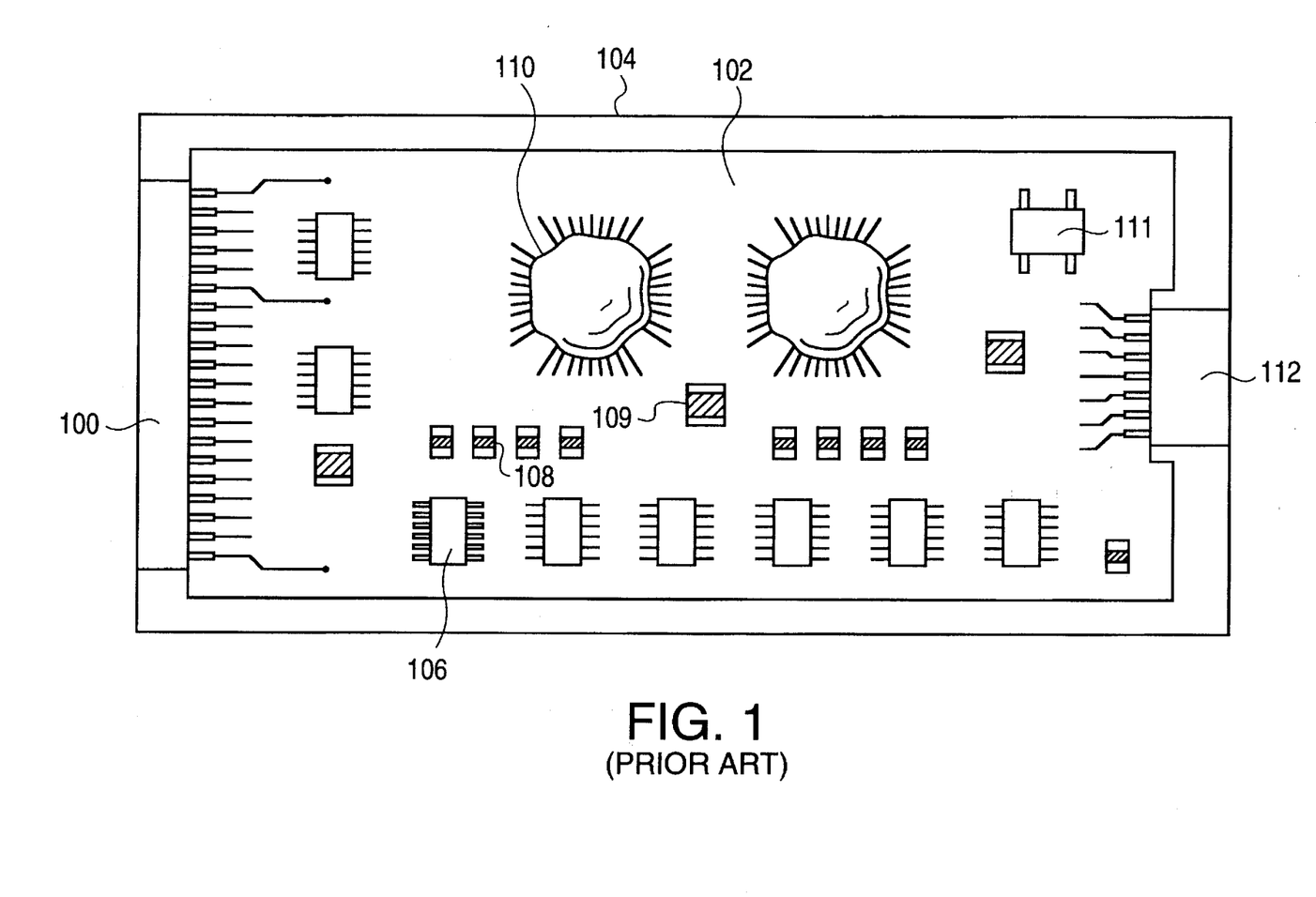
FIG. 1 is a top view illustrating a prior art PCMCIA card.

FIG. 1 illustrates a typical PCMCIA card, shown with the overlying protective cover removed so as to expose the printed wiring board (PWB) and attached circuit components. Housing 104 contains a PCMCIA connector 100 attached to a printed wiring board 102. An integrated circuit 110 having a "glob-top" protective coating, a traditional leaded plastic encapsulated integrated circuit 106, surface mounted chip components 108 and 109, and component 111 are each shown surface-mounted to the printed wiring board 102. Furthermore, a second connector 112 is also attached to the printed wiring board 102.

Even though affording many advantages over earlier assemblies, manufacturing costs are not insignificant. An assembly having an even lower manufacturing cost is desired.

SUMMARY OF THE INVENTION

It is an object of the current invention to provide an electronic assembly having lower manufacturing cost than with previously available techniques.

It is a further object of the current invention to provide an electronic assembly capable of high-volume production.

It is an advantage of the current invention to utilize production techniques largely leveraged by semiconductor assembly advances rather than by surface mount technology (SMT) on printed-wiring board (PWB) assembly cost structures.

These and other objects and advantages are achieved by the current invention, which in one embodiment provides for an electronic assembly for connecting to an electronic system which includes a first connector having a group of contacts, each having a mating portion and an interconnect finger. A first circuitry module having a first group of leads is included, wherein each of the leads is coupled directly to the interconnect finger of a corresponding one of the group of contacts of the first connector. The electronic assembly further includes a protective body encasing the first circuitry module and rigidly coupled to the first connector.

In an another embodiment of the current invention, a PCMCIA card assembly for connecting to a pin header of an industry-standard PCMCIA interface includes a PCMCIA receptacle assembly for connecting to the pin header of the PCMCIA interface, the PCMCIA receptacle assembly having a housing and a group of contacts, each contact having a socket portion for mating with a corresponding pin of the pin header, and each contact further having an interconnect finger extending outward of the housing. The PCMCIA card assembly further includes a first circuitry module having a first group of leads for providing a signal path to electronic components contained therewithin. A protective body is rigidly coupled to the PCMCIA receptacle assembly and is formed to encase the first circuitry module, for providing support and protection to the first circuitry module, and for providing a form factor suitable for the PCMCIA card assembly. Each of the first group of leads is coupled directly to the interconnect finger of a corresponding one of the group of contacts of the PCMCIA receptacle assembly.

In a method embodiment of the current invention, a method for producing an electronic assembly for connecting to an electronic system includes providing a first connector having a group of contacts, the first connector for connecting the electronic assembly to a mating connector of the electronic system, each of the group of contacts having a mating portion for electrically contacting a respective contact of the mating connector, and each of the group of contacts further having an interconnect finger. The method further includes fabricating a first circuitry module having a first group of leads, the leads for providing a signal path to electronic components contained within the first circuitry module. The method next includes coupling each of the first group of leads directly to the interconnect finger of a corresponding one of the group of contacts of the first connector, and then encasing the first circuitry module within a protective body rigidly coupled to the first connector, for providing support and protection to the first circuitry module, and for providing a form factor suitable for the electronic assembly.

DETAILED DESCRIPTION

The cost structure of currently available PCMCIA cards is based upon SMT/PWB technology (Surface Mount Technology/Printed Wiring Board). A lower cost PCMCIA card is achievable by replacing SMT/PWB technology with a multi-chip module (MCM) or equivalent technology, which leverages the cost of such a card upon the cost structure of semiconductor assembly technology, rather than upon traditional circuit board assembly technology.

Figure 2:
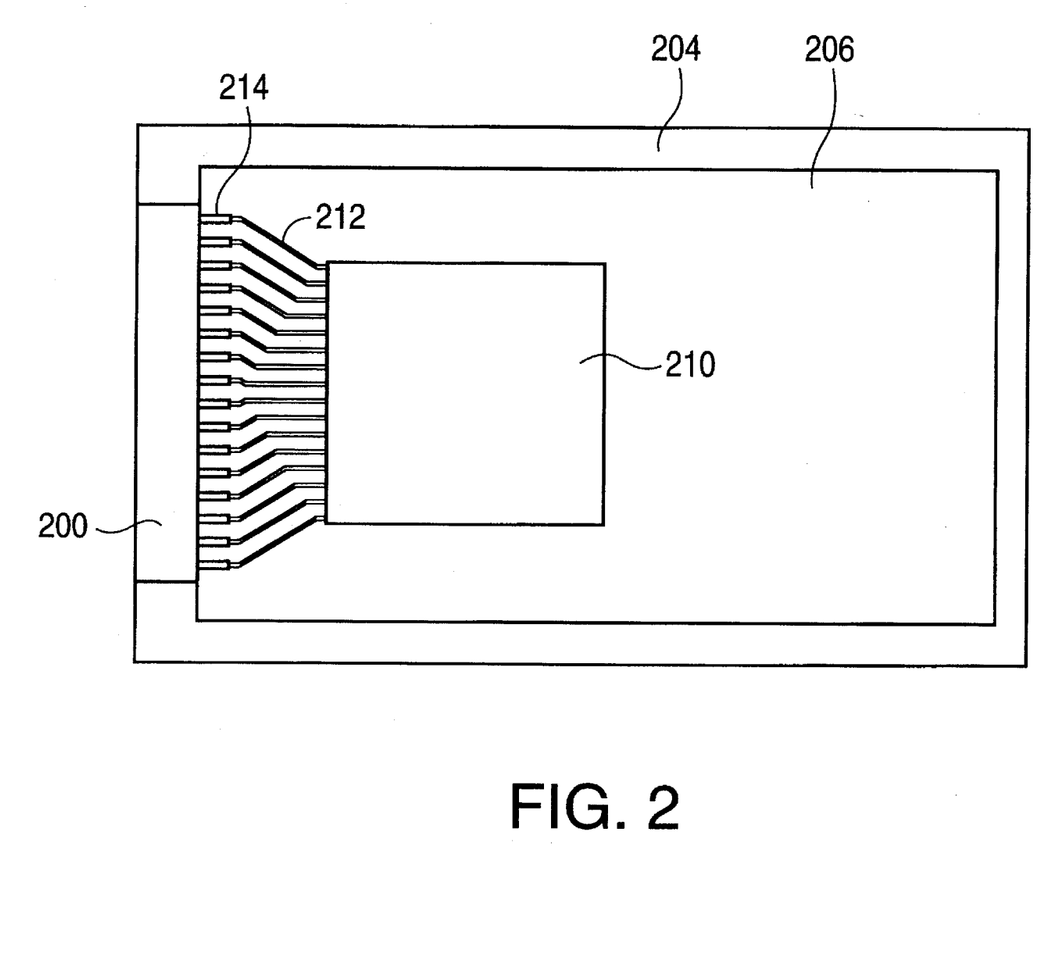
FIG. 2 is a top view illustrating one embodiment of the current invention, as applied to a PCMCIA card.

FIG. 2 illustrates a PCMCIA card implemented using the teachings of current invention. Circuitry module 210 is large enough to hold all the various integrated circuit components for the card (not shown) which are mounted to a leadframe contained therein. Furthermore, interconnections between various of these integrated circuits and to the outside world are accomplished using interconnections of the same leadframe, as is well known in the multi-chip module (MCM) art. Leadframe fingers 212 protrude or emanate from the circuitry module 210 and carry the electrical signals therefrom, and are connected directly to interconnect fingers 214 of PCMCIA connector 200. PCMCIA connectors having all interconnect fingers residing in the same plane are readily available, and have typically been used to make connections to a single side of a printed wiring board. Such connectors, which contain two rows of 25 connector receptacles each, are manufactured by forming each interconnect finger of one of the rows with a double bend, so as to align each of such fingers between two fingers from the opposite row of interconnect fingers. (The last interconnect finger having a double bend, of course, would not lie between two interconnect fingers from the opposite row, but would lie adjacent to only one.)

A frame 204 defines the edges of the PCMCIA card, and a bottom cover 206 and a top cover (not shown) similar to the bottom cover 206 close the cavity by encasing the circuitry module 210 to complete the manufacture of the card and form a protective enclosure rigidly coupled to the PCMCIA connector 200. Alternatively, a solid encapsulant such as a thermoset plastic may be used in lieu of the frame 204 and bottom plate 206 and top plate, as is discussed more fully in copending, commonly-assigned application Ser. No. 08/275,985, filed on Jul. 15, 1994, entitled "Removable Computer Peripheral Cards Having a Solid One-Piece Housing and Method of Manufacturing The Same" (Atty Docket No. NSC1P036NS24), naming inventors Hem P. Takiar and Michael W. Patterson, and which application is incorporated herein in its entirety.

By housing all the electronic components within a single circuitry module 210, much of the production costs of the card largely associated with printed wiring board assembly are avoided. Instead, by connecting leadframe fingers 212 directly to interconnect fingers 214 of the PCMCIA connector 200, card production cost is largely dictated by circuitry module 210 assembly costs, which are largely driven by semiconductor assembly cost efficiencies. In other words, lower manufacturing cost results from switching from a card based upon SMT/PWB to a card based upon, for example, an MCM equivalent. Plastic circuitry modules, such as a plastic leaded chip-carrier module, are useful for many low-cost products, while ceramic circuitry modules, such as a ceramic leaded chip-carrier, may be used for products requiring hermeticity or quartz windows.

Figure 3:
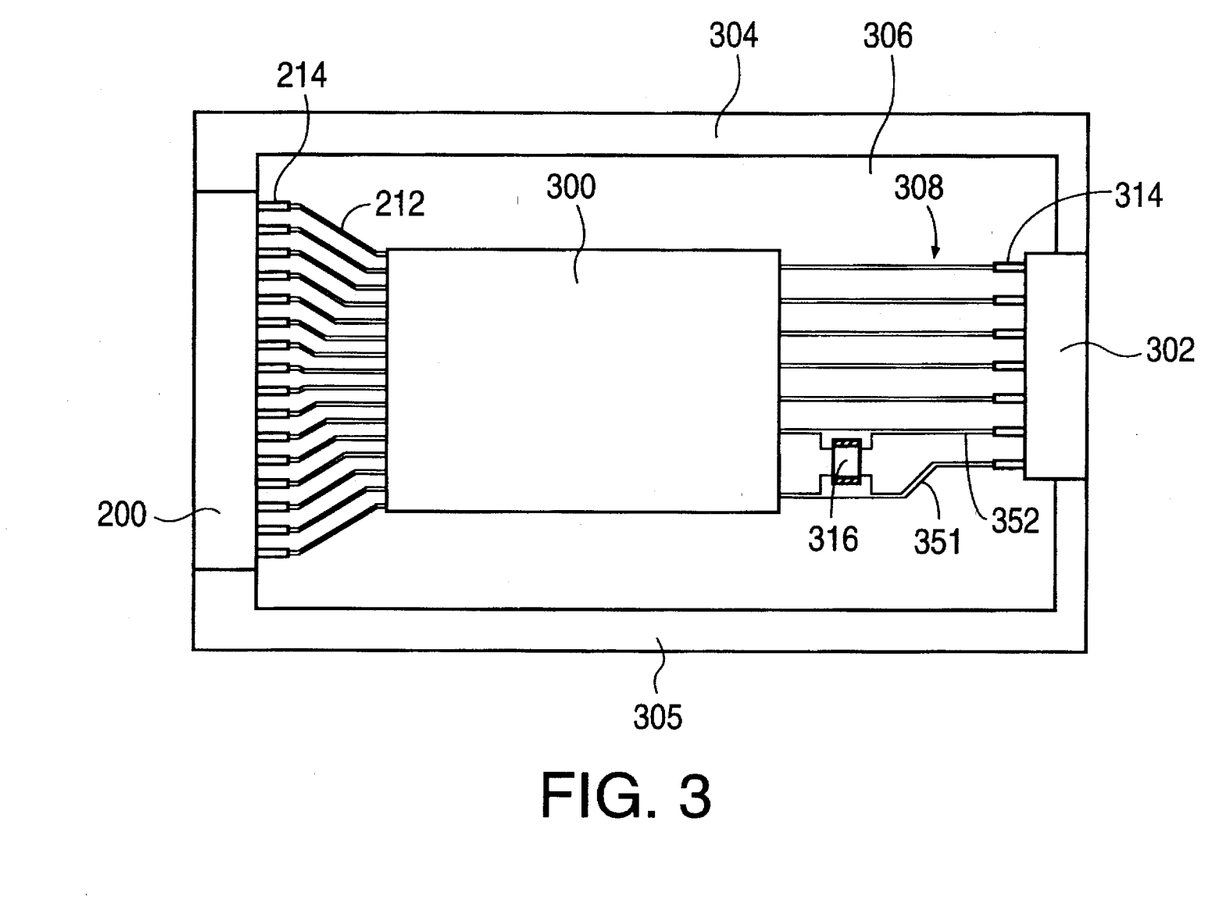
FIG. 3 is a top view illustrating an additional embodiment of the current invention, as applied to a PCMCIA card.

FIG. 3 illustrates another embodiment of an electronic assembly, in this case a PCMCIA card, in accordance with the current invention. Circuitry module 300 contains several integrated circuit components (not shown) which are mounted to a leadframe contained therein. As before, interconnections between various of these integrated circuits and to the outside world are accomplished using interconnections of the same leadframe, as is well known in the multi-chip module (MCM) art. Leadframe fingers 212 protrude from the circuitry module 300 and carry electrical signals therefrom, and are connected directly to interconnect fingers 214 of PCMCIA connector 200. An additional set of leadframe fingers 308 protrude from the opposite side of the circuitry module 300 and also carry electrical signals therefrom, and are connected directly to interconnect fingers 314 of an I/O connector 302. An optional capacitor 316 is shown surface mounted to two adjacent leadframe fingers 351 and 352 to provide a capacitive bypass and filtering. Other passive components, such as resistors, inductors, or crystals, may also be used. The I/O connector 302 of such a PCMCIA card is frequently used for a variety of purposes, including making connections to a telephone line for a FAX or modem, making connections to a network for a LAN or WAN interface, making connections to an instrument controller system (such as an IEEE-488 interface), and others.

Frame segments 304 and 305 together define the edges of the PCMCIA card, and a bottom cover 306 and a top cover (not shown) similar to the bottom cover 306 close the cavity by encasing the circuitry module 300 to complete the manufacture of the card, as before. Alternatively, as discussed above a solid encapsulant may also be used in lieu of the frame segments 304 and 305 and bottom plate 206 and a top plate. It should be noted that leadframe fingers 306 may still be used even though no I/O connector 302 is used, so that any necessary passive components, such as crystals, capacitors, inductors, resistors, and the like, may be coupled to circuitry module 300.

Figure 4:
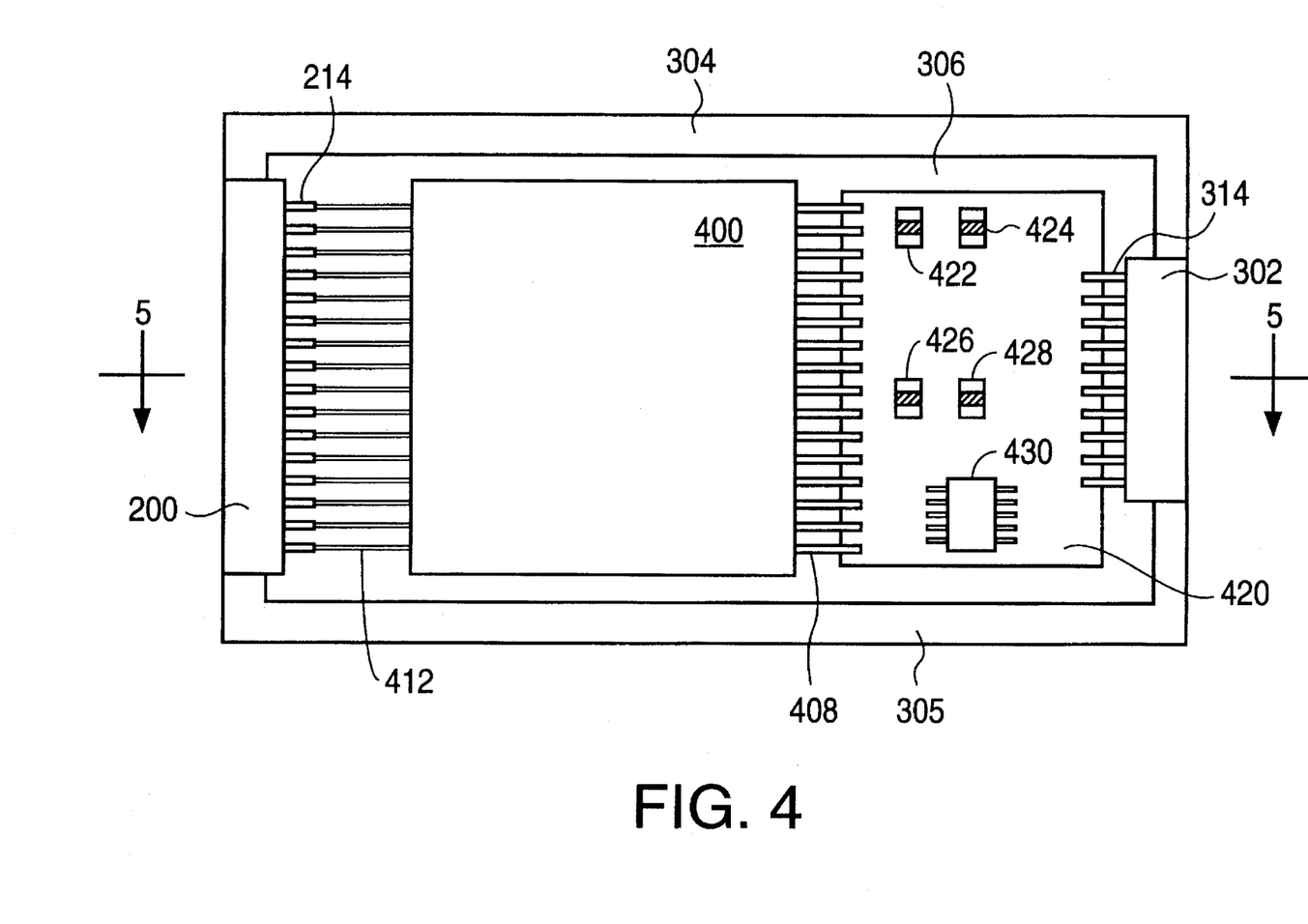
FIG. 4 is a top view illustrating yet another embodiment of the current invention, as applied to a PCMCIA card.

FIG. 4 illustrates yet another embodiment of a PCMCIA card in accordance with the current invention. Circuitry module 400 contains several integrated circuit components (not shown) which are mounted to a leadframe contained therein. Leadframe fingers 412 protruding from the circuitry module 400 are connected directly to coplanar interconnect fingers 214 of PCMCIA connector 200. An additional set of leadframe fingers 408 protrude from the opposite side of the circuitry module 400 and also carry electrical signals therefrom, and are connected directly to a second circuitry module, which in this embodiment is shown as a printed wiring board 420, and which for illustration purposes is shown containing chip components 422, 424, 426, and 428, and packaged integrated circuit 430, all mounted thereon. The interconnect fingers 314 of I/O connector 302 are also shown connected to printed wiring board 420. As before, frame segments 304 and 305 together define portions of the edges or perimeter of the PCMCIA card, and a bottom cover 306 and a top cover (not shown) similar to the bottom cover 306 close the cavity to complete the manufacture of the card. As before, a solid encapsulant may also be used in lieu of the frame segments 304 and 305 and bottom plate 206 and a top plate.

Figure 5:
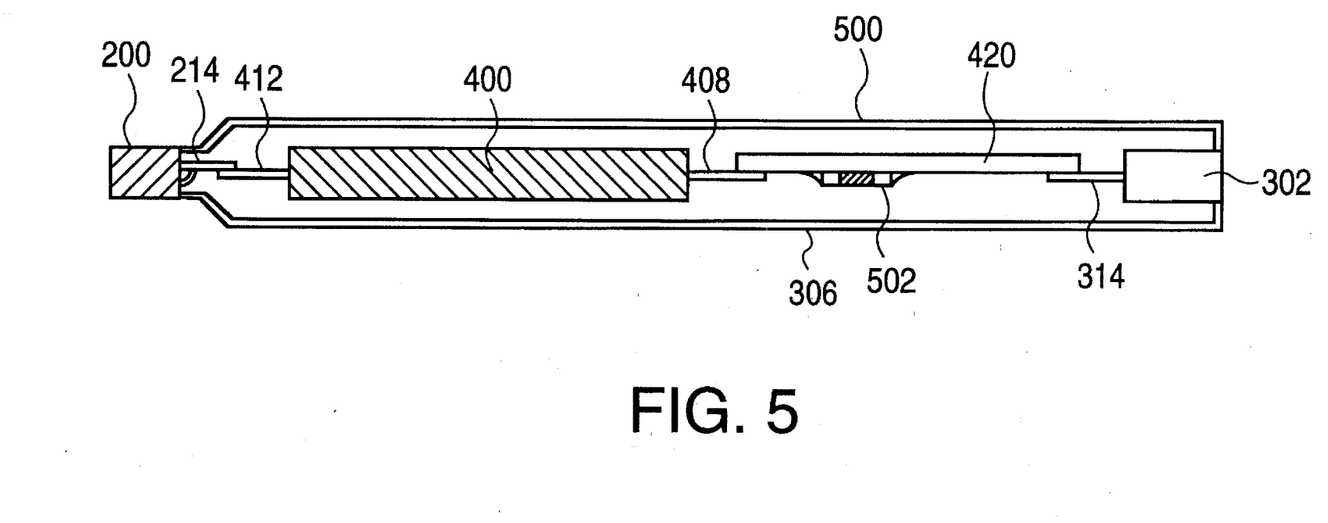
FIG. 5 is a cross-sectional view of the embodiment shown in FIG. 4.

FIG. 5 shows a cross-sectional view of the embodiment shown in FIG. 4. Interconnect fingers 214 of PCMCIA connector 200 are shown directly connected to leadframe fingers 412 which protrude from circuitry module 400. Leadframe fingers 408, also protruding from circuitry module 400, are connected to printed wiring board 420, as are interconnect fingers 314 on I/O connector 302. A surface mounted component 502 is shown mounted to the bottom surface of printed wiring board 502. Lastly, bottom cover 306 and a top cover 500 are shown connected to PCMCIA connector 200 and I/O connector 302 and enclose the cavity containing the circuitry module 400 and the printed wiring board 420 to complete the manufacture of the PCMCIA card.

Figure 6:
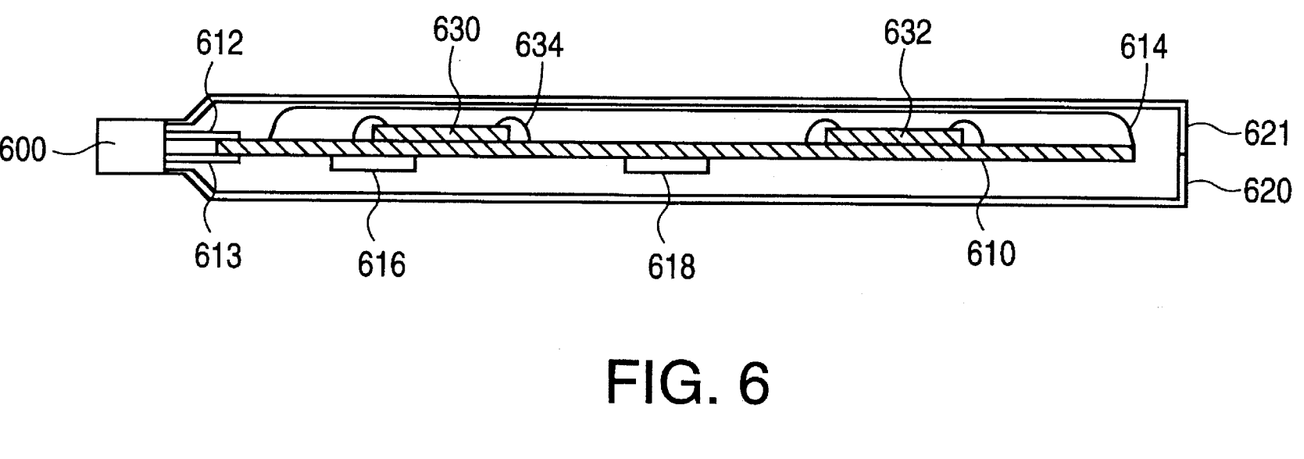
FIG. 6 is a cross-sectional view illustrating yet another embodiment of the current invention, as applied to et PCMCIA card.

FIG. 6 shows a cross-sectional view of an additional embodiment of a PCMCIA card using a small printed wiring board. Interconnect fingers 612 and 613 of PCMCIA connector 600 are shown directly connected to respective top and bottom surfaces of printed wiring board 610. Alternatively, a PCMCIA connector having coplanar interconnect fingers, as discussed in relation to FIG. 2, may be used to connect to traces on either the top or the bottom surface of printed wiring board 610. An optional I/O connector (not shown) may also be connected to printed wiring board 610, as discussed above.

A molded encapsulant 614 protects the entire top surface of printed wiring board 610, including integrated circuits 630 and 632 which are mounted upon the top surface of printed wiring board 610, and which are connected to conductor traces (not shown) by, for example, wire bonds such as wire bond 634. Such an encapsulant is similar to a direct chip-on-board encapsulant technique frequently referred to as "glob-top" encapsulation, but here encapsulates each of the integrated circuits 630 and 632 an all other integrated circuits which may be mounted upon the top surface of printed wiring board 610. Alternatively, a "flip-chip" technique using a ball grid array formation may also be used to attach integrated circuit components to the printed wiring board 610. Optional surface mounted components 616 and 618 are shown mounted to the bottom surface of printed wiring board 610. Bottom cover 620 and top cover 621 are shown rigidly coupled to PCMCIA connector 600 and enclose the cavity containing the printed wiring board 610 to complete the manufacture of the PCMCIA card.

It should be readily apparent to one skilled in the art that many variations in the above embodiments are possible without departing from the spirit or scope of the instant invention. For example, a variety of leadframe configurations or other substrate techniques may be employed, and which may still be viewed as circuitry modules typically containing or adaptable to containing one or more integrated circuits. I/O connectors may or may not be employed with any of the possible embodiments. Passive components may be attached to either group of leadframes internal to the PCMCIA card, or not, as the case may be.

It should also be readily apparent to one skilled in the art that the teachings of the present invention, even though discussed above in the context of a PCMCIA peripheral card, are equally applicable to a wide variety of electronic assemblies which may be attached to an electronic system. The invention is not necessarily limited to PCMCIA cards. For example, suitable connectors may be either male or female connectors, of a wide variety of configurations. Other examples are D-shell connectors commonly associated with common serial or parallel peripheral ports, and any of the variety of high density connectors, such as those commonly utilized for expansion ports on laptop computers.

While the invention has been described with respect to the embodiments set forth above, the invention is not necessarily limited to these embodiments. Accordingly, other embodiments, variations, and improvements not described herein are not necessarily excluded from the scope of the invention, which is defined by the following claims.

What is claimed is:

1. An electronic assembly for connecting to an electronic system, comprising:

a first connector having a plurality of contacts, said first connector for connecting said electronic assembly to a mating connector of said electronic system, each of said plurality of contacts having a mating portion for electrically contacting a respective contact of said mating connector, each of said plurality of contacts further having an interconnect finger; and a first circuitry module having a first plurality of leads for providing signal paths to electronic components contained within said first circuitry module; and a protective body rigidly coupled to said first connector, said protective body formed to encase said first circuitry module, for providing support and protection to said first circuitry module;

wherein each of said first plurality of leads is coupled directly to said interconnect finger of a corresponding one of said plurality of contacts of said first connector.

2. An electronic assembly as in claim 1, wherein said first connector comprises a male connector.

3. An electronic assembly as in claim 1, wherein said first connector comprises a female connector.

4. An electronic assembly as in claim 3, wherein said first connector comprises a female PCMCIA Personal Computer Memory Card International Association connector.

5. An electronic assembly as in claim 1 wherein said first circuitry module comprises a molded plastic chip-carrier module having said first plurality of leads integrated therewithin and emanating therefrom.

6. An electronic assembly as in claim 5 wherein said molded plastic chip-carrier module includes an integrated circuit.

7. An electronic assembly as in claim 5 wherein said molded plastic chip-carrier module includes a plurality of integrated circuits.

8. An electronic assembly as in claim 1 wherein said first circuitry module comprises a ceramic chip-carrier module having said first plurality of leads integrated therewithin and emanating therefrom.

9. An electronic assembly as in claim 8 wherein said ceramic chip-carrier module includes an integrated circuit.

10. An electronic assembly as in claim 8, wherein said ceramic chip-carrier module includes a plurality of integrated circuits.

11. An electronic assembly as in claim 1, wherein said first circuitry module comprises:

a printed wiring board having a plurality of conductive traces disposed upon a first side thereof, and further having a second side thereof;

a plurality of integrated circuits mounted upon said first side of said printed wiring board;

a molded encapsulant body formed upon said first side to fully encapsulate said plurality of integrated circuits mounted thereupon; and a plurality of electronic components mounted upon said second side of said printed wiring board, each of which being electrically coupled to one of said plurality of conductive traces.

12. An electronic assembly as in claim 1 wherein said protective body includes thin panels attached to a frame member, said frame member defining a perimeter of said electronic assembly.

13. An electronic assembly as in claim 1 wherein said protective body includes a solid, molded encapsulant.

14. An electronic assembly as in claim 13 wherein said solid, molded encapsulant includes a thermoset plastic.

15. An electronic assembly as in claim 1 further comprising a second plurality of leads integrated within and emanating from said first circuitry module, said second plurality of leads providing a signal path to certain of said electronic components contained within said first circuitry module.

16. An electronic assembly as in claim 15 further comprising:

a second connector having a plurality of contacts, said second connector for connecting said assembly to a mating connector of a second electronic system, each of said plurality of contacts of said second connector having a mating portion for electrically contacting a respective contact of said mating connector, each of said plurality of contacts further having an interconnect finger;

wherein each of said second plurality of leads is coupled to said interconnect finger of a corresponding one of said plurality of contacts of said second connector.

17. An electronic assembly as in claim 16 wherein each of said second plurality of leads is directly coupled to said interconnect finger of a corresponding one of said plurality of contacts of said second connector.

18. An electronic assembly as in claim 16 further comprising:

a second circuitry module;

wherein each of said second plurality of leads is coupled to said interconnect finger of a corresponding one of said plurality of contacts of said second connector by way of a connection path through said second circuitry module.

19. An electronic assembly as in claim 16 wherein said second connector of said electronic assembly is disposed generally opposite to said first connector.

20. An electronic assembly as in claim 15 further comprising a passive component coupled to certain of said second plurality of leads.

21. An electronic assembly as in claim 20 wherein said passive component comprises a component chosen from the group consisting of crystals, resistors, capacitors, and inductors.

22. An electronic assembly as in claim 1 further comprising a passive component coupled to certain of said first plurality of leads.

23. A PCMCIA card assembly for connecting to a pin header of an industry-standard PCMCIA interface, comprising:

a PCMCIA receptacle assembly for connecting to said pin header of said PCMCIA interface, said PCMCIA receptacle assembly having a housing and a plurality of contacts, each contact having a socket portion for mating with a corresponding pin of said pin header, each contact further having an interconnect finger extending outward of said housing;

a first circuitry module having a first plurality of leads for providing a signal path to electronic components contained therewithin; and a protective body rigidly coupled to said PCMCIA receptacle assembly, said body formed to encase said first circuitry module, for providing support and protection to said first circuitry module, and for providing a form factor suitable for said PCMCIA card assembly;

wherein each of said first plurality of leads is coupled directly to said interconnect finger of a corresponding one of said plurality of contacts of said PCMCIA receptacle assembly.

24. A PCMCIA card assembly as in claim 23 wherein said first circuitry module comprises a molded plastic chip-carrier module having said first plurality of leads integrated therewithin and emanating therefrom.

25. A PCMCIA card assembly as in claim 24 wherein said molded plastic chip-carrier module includes an integrated circuit.

26. A PCMCIA card assembly as in claim 24 wherein said molded plastic chip-carrier module includes a plurality of integrated circuits.

27. A PCMCIA card assembly as in claim 23 wherein said first circuitry module comprises a ceramic chip-carrier module having said first plurality of leads integrated therewithin and emanating therefrom.

28. A PCMCIA card assembly as in claim 27 wherein said ceramic chip-carrier module includes an integrated circuit.

29. A PCMCIA card assembly as in claim 27 wherein said ceramic chip-carrier module includes a plurality of integrated circuits.

30. A PCMCIA card assembly as in claim 23, wherein said first circuitry module comprises:

a printed wiring board having a plurality of conductive traces manufactured upon a first side thereof, and further having a second side thereof;

a plurality of integrated circuits mounted upon said first side of said printed wiring board;

a molded encapsulant body formed upon said first side to fully encapsulate said plurality of integrated circuits mounted thereupon; and a plurality of electronic components mounted upon said second side of said printed wiring board, each of which being electrically coupled to one of said plurality of conductive traces.

31. A PCMCIA card assembly as in claim 23 wherein said protective body includes thin panels attached to a frame member, said frame member defining a perimeter of said PCMCIA card assembly.

32. A PCMCIA card assembly as in claim 23 wherein said protective body includes a solid, molded encapsulant formed to provide a form factor suitable for said PCMCIA card assembly.

33. A PCMCIA card assembly as in claim 32 wherein said solid, molded encapsulant includes a thermoset plastic.

34. A PCMCIA card assembly as in claim 23 further comprising a second plurality of leads integrated with and emanating from said first circuitry module, said second plurality of leads providing a signal path to certain of said electronic components contained within said first circuitry module.

35. A PCMCIA card assembly as in claim 34 further comprising:

a connector having a plurality of contacts, said connector for connecting said PCMCIA card assembly to a mating connector of a second electronic system, each of said plurality of contacts of said connector having a mating portion for electrically contacting a respective contact of said mating connector, each of said plurality of contacts further having an interconnect finger;

wherein each of said second plurality of leads is coupled to said interconnect finger of a corresponding one of said plurality of contacts of said connector.

36. A PCMCIA card assembly as in claim 35 wherein said second plurality of leads is directly coupled to said interconnect finger of a corresponding one of said plurality of contacts of said connector.

37. A PCMCIA card assembly as in claim 35 further comprising:
- a second circuitry module;
- wherein each of said second plurality of leads is coupled to said interconnect finger of a corresponding one of said plurality of contacts of said connector by way of a connection path through said second circuitry module.

38. A PCMCIA card assembly as in claim 35 wherein said connector of said PCMCIA card assembly is disposed generally opposite to said PCMCIA receptacle assembly.

39. A PCMCIA card assembly as in claim 34 further comprising a passive component coupled to certain of said second plurality of leads.

40. A PCMCIA card assembly as in claim 39 wherein said passive component comprises a component chosen from the group consisting of crystals, resistors, capacitors, and inductors.

41. A PCMCIA card assembly as in claim 23 further comprising a passive component coupled to certain of said first plurality of leads.

* * * * *